United States Patent
Lopez et al.

(10) Patent No.: US 9,653,665 B2
(45) Date of Patent: May 16, 2017

(54) LED DOME WITH INNER HIGH INDEX PILLAR

(71) Applicant: KONINKLIJKE PHILIPS N.V., Eindhoven (NL)

(72) Inventors: Toni Lopez, San Jose, CA (US); Kenneth Vampola, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/907,513

(22) PCT Filed: Jul. 2, 2014

(86) PCT No.: PCT/IB2014/062793
§ 371 (c)(1),
(2) Date: Jan. 25, 2016

(87) PCT Pub. No.: WO2015/011586
PCT Pub. Date: Jan. 29, 2015

(65) Prior Publication Data
US 2016/0163936 A1   Jun. 9, 2016

Related U.S. Application Data

(60) Provisional application No. 61/858,658, filed on Jul. 26, 2013.

(51) Int. Cl.
*H01L 33/58* (2010.01)
*H01L 33/54* (2010.01)
(Continued)

(52) U.S. Cl.
CPC ............ *H01L 33/58* (2013.01); *H01L 33/502* (2013.01); *H01L 33/507* (2013.01); *H01L 33/54* (2013.01);
(Continued)

(58) Field of Classification Search
CPC ...................................................... H01L 33/58
See application file for complete search history.

(56) References Cited

U.S. PATENT DOCUMENTS 6,455,878 B1   9/2002   Bhat et al.
2007/0257271 A1   11/2007   Ouderkirk et al.
(Continued)

FOREIGN PATENT DOCUMENTS

WO   2011030789 A1   3/2011

OTHER PUBLICATIONS

EPO as ISA, PCT/IB2014/062793, filed Jul. 2, 2014, "International Search Report and Written Opinion" dated Oct. 31, 2014, 9 pages.

*Primary Examiner* — Jamie C Niesz
(74) *Attorney, Agent, or Firm* — Brian D. Ogonowsky; Patent Law Group LLP

(57) ABSTRACT

Affixed over a transparent growth substrate (34) of an LED die (30) is a transparent rectangular pillar (40), having a footprint approximately the same size as the LED die. The pillar height is greater than a length of the LED die, and the pillar has an index (n) approximately equal to that of the substrate (e.g., 1.8), so there is virtually no TIR at the interface due to the matched indices. Surrounding the pillar and the LED die is a lens portion (42) having a diameter between 1.5-3 times the length of the LED die. The index of the lens portion is about 0.8 times the index of the substrate. The lens portion may have a dome shape (46). A large portion of the light exiting the substrate is internally reflected off the lateral pillar/cylinder interface and exits the top surface of the pillar. Thus, the emission is narrowed and light extraction efficiency is increased.

14 Claims, 5 Drawing Sheets

(51) Int. Cl.
*H01L 33/56* (2010.01)
*H01L 33/50* (2010.01)
*H01L 33/60* (2010.01)
*H01L 33/00* (2010.01)

(52) U.S. Cl.
CPC ............. *H01L 33/56* (2013.01); *H01L 33/60* (2013.01); *H01L 33/0079* (2013.01); *H01L 2933/0058* (2013.01)

(56) References Cited

U.S. PATENT DOCUMENTS

| | | | |
|---|---|---|---|
| 2009/0173958 A1* | 7/2009 | Chakraborty | H01L 33/501 257/98 |
| 2011/0062469 A1* | 3/2011 | Camras | H01L 33/58 257/98 |
| 2016/0163936 A1* | 6/2016 | Lopez | H01L 33/54 257/98 |

* cited by examiner

LED DOME WITH INNER HIGH INDEX PILLAR

CROSS-REFERENCE TO RELATED APPLICATIONS

The present application is a §371 application of International Application No. PCT/IB2014/062793 filed on Jul. 2, 2014 and entitled "LED DOME WITH INNER HIGH INDEX PILLAR," which claims the benefit of U.S. Provisional Application Ser. No. 61/858,658, filed Jul. 26, 2013. Both PCT/IB2014/062793 and U.S. 61/858,658 are incorporated herein.

FIELD OF THE INVENTION

This invention relates to light emitting diodes (LEDs) and, in particular, to a technique for increasing the light extraction efficiency of such an LED.

BACKGROUND

The light extraction efficiency (ExE) of LED devices is limited by total internal reflections (TIR) in the high refractive index (n) epitaxial layers, where light is generated. In order to mitigate this TIR, high refractive index encapsulation dome lenses are widely employed as they can effectively boost ExE by as much as 20%. The refractive index of a GaN based LED is between 2-3, and the index of the encapsulation material is typically between 1.4-1.8 to provide a good transition between the GaN and air.

In LED die architectures such Thin-Film-Flip-Chip (TFFC) direct emitters, light is primarily extracted from a single side of the epitaxial layers. The light extraction side is commonly the one exposed to the air after the growth substrate is removed (e.g., by a laser-assisted lift-off process). With a proper surface roughening treatment of the light extraction surface, the extraction efficiency in such direct emitters after dome encapsulation can be as high as 80%, even in cases of rather poor submount reflectivity, since there is little downward side light from the thin epitaxial layers.

The situation can significantly change in Flip-Chip (FC) architectures, such as in Patterned Sapphire Substrate (PSS) based LEDs, where the sapphire growth substrate is not removed but kept for various reasons. In such a device, light from the epitaxial layers enters the transparent substrate, and the opposite surface of the substrate emits the light. Light must thus be extracted from the epitaxial material (e.g., GaN) into the substrate, and from the substrate into either the air or the dome encapsulation material and then air. The field emission of such LED device is much wider, since a great portion of the light is extracted from the four lateral sides of the substrate (typically a couple of hundred microns thick). A good portion of the extracted lateral emission is directed downward at the submount, where it gets reflected back with losses. As such, FC architectures such as PSS based dies rely on high reflective package submounts to offer extraction efficiencies comparable to those of TFFCs. An example of such an FC based LED device is shown in FIGS. 1 and 2, where FIG. 2 is a left side view of the device of FIG. 1.

In FIGS. 1 and 2, LED epitaxial layers 12, including an active layer, are grown on a patterned (roughened) sapphire substrate 14 surface. The epitaxial layers 12 are not identified in FIG. 1 for simplicity and are much thinner relative to the substrate 14 than shown in FIG. 2.

Reflective metal electrodes 15A and 15B are formed on the bottom surface of the LED die 16, and the electrodes are directly bonded to anode and cathode metal pads 18A and 18B on a submount 22. The body of the submount 22 may be ceramic or some other thermally conductive material. The pads 18A and 18B are connected, using vias internal to the submount 22, to associated bottom metal pads 23 (only one pad 23 is shown in the side view). The bottom pads 23 may be later soldered to a printed circuit board. The metal pads 18A and 18B may be reflective to reflect light (such as light ray 26) that is emitted from the lateral sides of the substrate 14. Note how, in FIG. 2, the light ray 26 emitted by the epitaxial layers 12 impinges on the substrate 14 top surface at a shallow angle, is reflected by TIR, exits the side wall of the substrate 14, and is reflected upward by the pad 18A on the submount 22. Hence, the light ray 26 is attenuated by each reflection and the extra distance traveled within the various materials.

A domed lens 28 is then affixed over the LED die 16 either by molding or by affixing a pre-formed lens over the LED die 16 with an adhesive encapsulant (e.g., silicone or epoxy).

It is known that increasing the thickness of the substrate 14, perhaps by as much as 800 microns, yields ExE gains, but that creates fabrication problems and increases cost. With a thicker substrate 14, the light that impinges on its top surface is at an angle closer to the normal angle and thus less TIR occurs. Further, more shallow-angle light is emitted from the thick substrate's sidewalls. This creates a wide emission angle that may not be desirable for some applications.

Thus, what is needed is a technique to increase the light extraction efficiency (ExE) of an LED device without having to increase the thickness of the growth substrate.

SUMMARY

In one embodiment, GaN based LED layers are epitaxially grown on a patterned surface of a transparent sapphire substrate. The substrate thickness, after thinning, may be between 100-500 microns.

The LED die is then mounted on a submount. Multiple LED dies may be mounted on a submount wafer so that the processing may be done on a wafer scale. After all the processing, the submount wafer is singulated to separate the individual LED devices.

The LED die footprint will typically be a square with each side between 0.5-1 mm.

A transparent rectangular pillar (a rectangular prism), having a footprint approximately the same size as the LED die, is positioned directly on the top substrate surface of the LED die. The pillar is formed of a material (e.g., silicone) that has an index (n) approximately equal to that of the sapphire substrate (approximately 1.8), so there is virtually no TIR due to the matched indices. The pillar has a height greater than the length of the LED die sides (e.g., 0.8 mm-1.5 mm).

Surrounding the rectangular pillar and the LED die is a transparent cylinder, where the top surface of the cylinder is approximately even with the top surface of the pillar. The diameter of the cylinder is preferably between 1.5-3 times the length of the LED die side. The index of refraction of the cylinder material is about 0.8 times the index of the substrate, which is about 1.4-1.5 in the case of a sapphire substrate with an index of about 1.8.

On top of the cylinder is a transparent dome formed of the same material as the cylinder and having the same diameter. The dome may be integral with the cylinder.

The pillar, cylinder, and dome may be formed as a pre-formed lens piece and affixed to the substrate and the submount with a thin layer of an index-matching silicone or epoxy.

If phosphor-converted light is desired, the LED die surface may be coated with a phosphor prior to affixing the lens over the LED die. The index of the phosphor preferably matches that of the pillar and substrate.

Since the pillar is relatively tall, and the interface of the cylinder and the pillar has a significant index mismatch, the light emitted from the LED die will either directly pass through the top surface of the pillar or be internally reflected off the sides of the pillar and through the top surface. Thus there is reduced side light that needs to be reflected by the submount. Accordingly, the pillar serves to narrow the emission field, since it is as wide as the LED die itself, as well as improves efficiency since less light is attenuated by the submount surface.

The cylinder and dome provide an index transition to the air, so as to improve light extraction, and make the light emission more Lambertion. Lenses other than hemispherical domes may be used to create a desired emission pattern. The dome shape may be adapted to the actual emission from the pillar to further increase extraction efficiency.

This invention also applies to LED dies other than flip-chips.

Other embodiments are described.

BRIEF DESCRIPTION OF THE DRAWINGS

Elements that are the same or similar are labeled with the same numeral.

DETAILED DESCRIPTION

FIGS. 3-8 illustrate various stages of the fabrication process for the inventive LED device.

Figure 1:
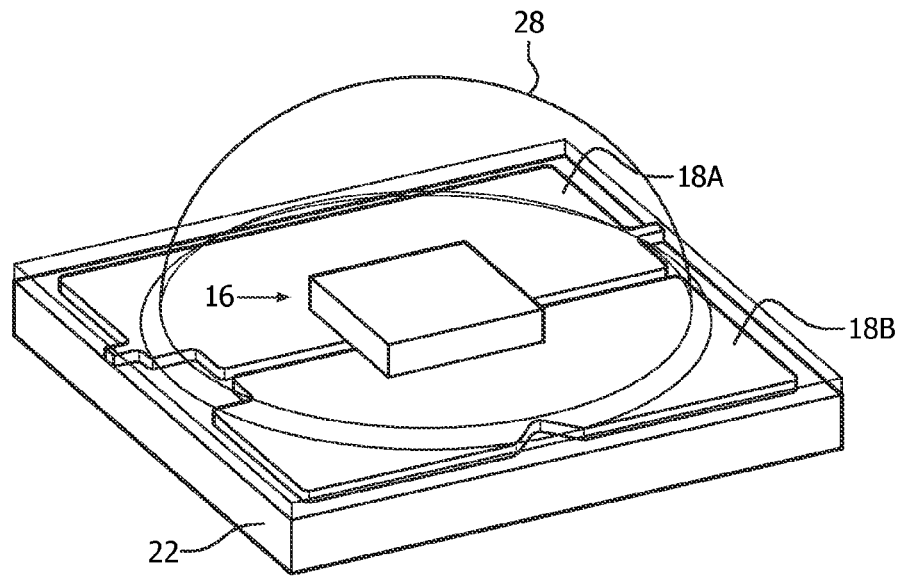
FIG. 1 is a perspective view of a packaged LED device.
Figure 2:
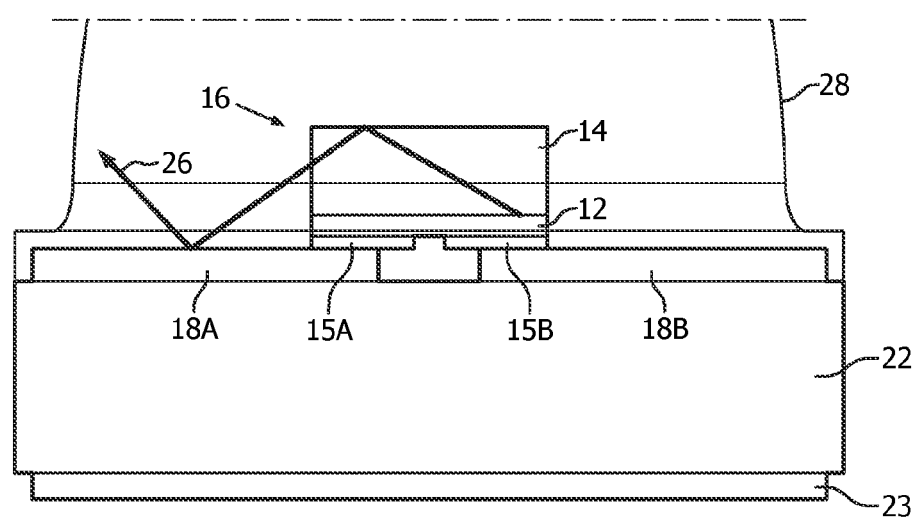
FIG. 2 is a left side view of the LED device of FIG. 1.
Figure 3:
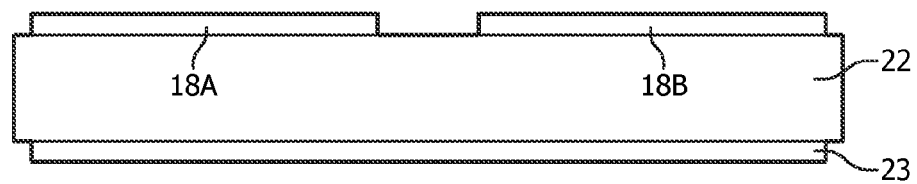
FIG. 3 is a side view of the submount of FIG. 1.

FIG. 3 illustrates a conventional submount 22, which may be the same as described with respect to FIGS. 1 and 2. Any other type of submount or other support substrate may be used, such as a printed circuit board (PCB).

Figure 4:
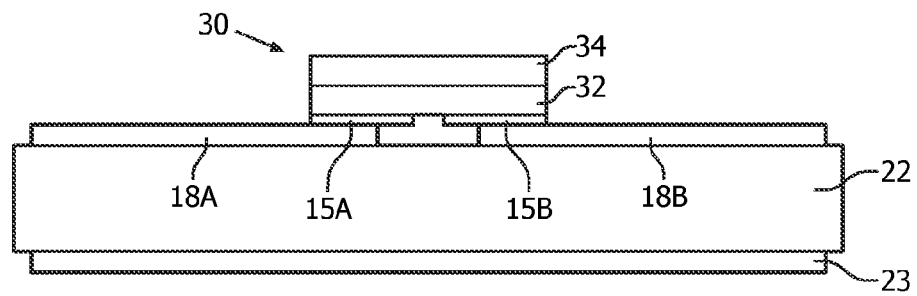
FIG. 4 is a side view of the submount of FIG. 1 with an LED die mounted on it.

FIG. 4 illustrates a conventional LED die 30 having its bottom anode and cathode electrodes 15A and 15B ultrasonically bonded or soldered to the metal pads 18A and 18B of the submount 22. The LED die 30 comprises epitaxial layers 32 grown on a patterned (roughened) surface of a sapphire substrate 34 for improved light extraction. Other types of transparent substrates may be used, such as SiC, GaN, etc. In an actual embodiment, the substrate 34 is much thicker than the epitaxial layer 32. In one embodiment, the substrate 34 is 100-500 microns thick, and in a preferred embodiment is about 200 microns thick. The epitaxial layers 32 may be only a few microns thick. Note that the substrate 34 may be much thinner than the substrate 14 in FIG. 2 since its thickness is not being used to increase light extraction. This can be beneficial as it facilitates die singulation during the fabrication process.

In one embodiment, the LED die 30 is a square having sides 0.5-1 mm long. The LED die 30 may be a blue die coated with a phosphor, or may be any other type of LED die. Although a flip-chip is shown, the LED die may be other types, with provisions made in the lens for any wire bonding needed to connect the LED die electrodes to the submount (or other support substrate) pads.

Figure 5:
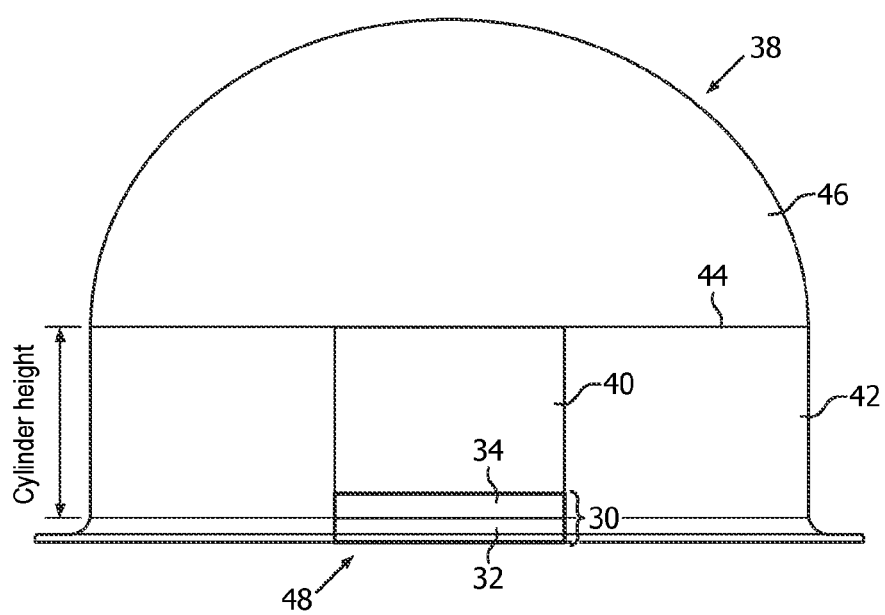
FIG. 5 is a side view of the pre-formed completed lens.

FIG. 5 illustrates a pre-formed lens 38 in accordance with one embodiment of the invention. The position of the LED die 30 in the cavity of the lens 38 is shown for clarity.

The lens 38 includes a transparent rectangular pillar 40 (a rectangular prism), having a footprint approximately the same size as the LED die 30. The pillar 40 is formed of a material (e.g., silicone, epoxy, etc.) that has an index of refraction (n) approximately equal to that of the sapphire substrate 34 (approximately 1.8), so there is virtually no TIR at the interface between substrate 34 and pillar 40 due to the matched indices. In one embodiment, the difference between the index of refraction of the pillar 40 and the index of refraction of the substrate 34 is less than 10%. Typically, the pillar 40 has a height greater than the length of the LED die sides (e.g., 0.8 mm-1.5 mm) but other configurations are contemplated and are included within the scope of the invention. For example, the pillar 40 may overlap the LED die 30 or may only cover a portion of the light emitting surface. In the alternative, the pillar 40 may be shorter than the length of the LED die 30 to produce different light distribution effects.

Surrounding the rectangular pillar 40 is a transparent cylinder 42, where the top surface 44 of the cylinder 42 is approximately level with the top surface of the pillar 40. It is not essential that the top of the cylinder 42 align with the top of the pillar 40. The diameter of the cylinder 42 is preferably between 1.5-3 times the length of the LED die side. The index of refraction of the cylinder material is about 0.8 times the index of the substrate 34, which is about 1.4-1.5 in the case of a sapphire substrate 34 with an index of about 1.8. A suitable range of indices of the cylinder material is about 0.6 to 0.85 times the index of the substrate 34.

On top of the cylinder 42 is a transparent dome 46 formed of the same material as the cylinder 42 and having the same diameter. Typically, the cylinder 42 and dome 46 will be formed as a single piece.

A cavity 48 in the lens 38 is about the same size as the LED die 30 so that the bottom of the cylinder 42 may be flush with the submount 22 surface.

Figure 6:
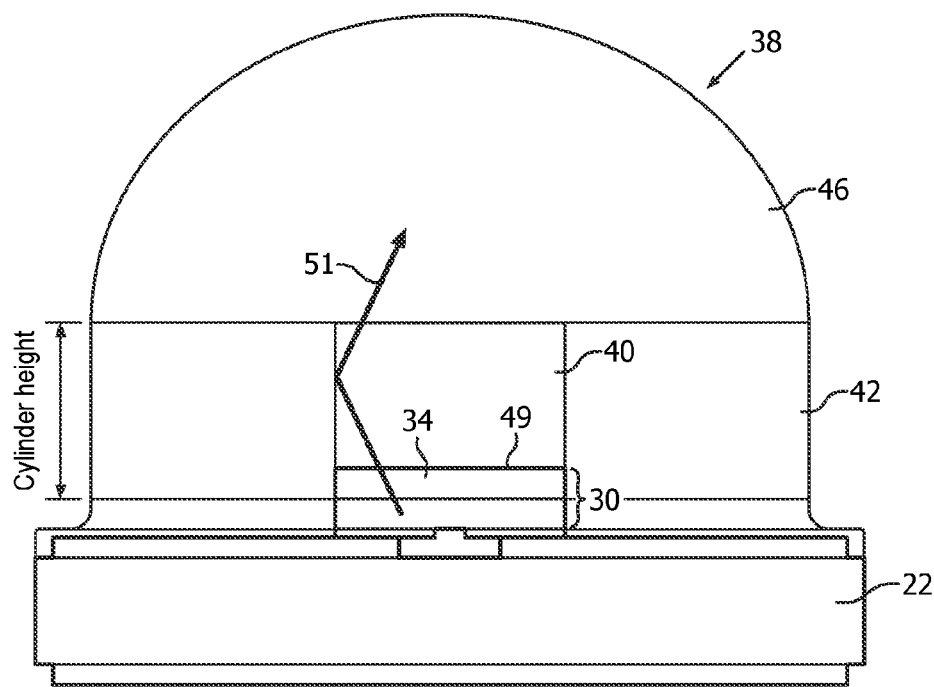
FIG. 6 is a side view of the lens of FIG. 5 affixed over the LED die of FIG. 4.

The pillar 40, cylinder 42, and dome 46 may be pre-formed as a single piece and affixed to the substrate 34 and the submount 22 with a thin layer (e.g., 10 microns) of an index-matching silicone or epoxy 49, as shown in FIG. 6. Such adhesives, having selectable indices, are commercially available.

In one example, the pillar 40 is molded as an array of pillars, and the cylinder 42 and dome 46 are molded around each pillar 40. The resulting lenses 38 are then separated and affixed to the respective LED dies 30 on the submount wafer in a wafer scale process. In another embodiment, the cylinder 42 and dome 46 are integrally formed of glass or other material (e.g., silicone) and its cavity is used as a mold for the pillar material. In another embodiment, the pillar 40 may be a high index glass (e.g., SF11 type) and may be attached to the substrate 34 (or phosphor) with a high index transparent epoxy. Next, a silicone based lens portion (cylinder 42 and dome 46) may be formed over the pillar 40 and submount wafer by means of an over molding process, such as described in U.S. Pat. No. 7,452,737 by Basin et al., assigned to the present assignee and incorporated herein by reference.

Figure 7:
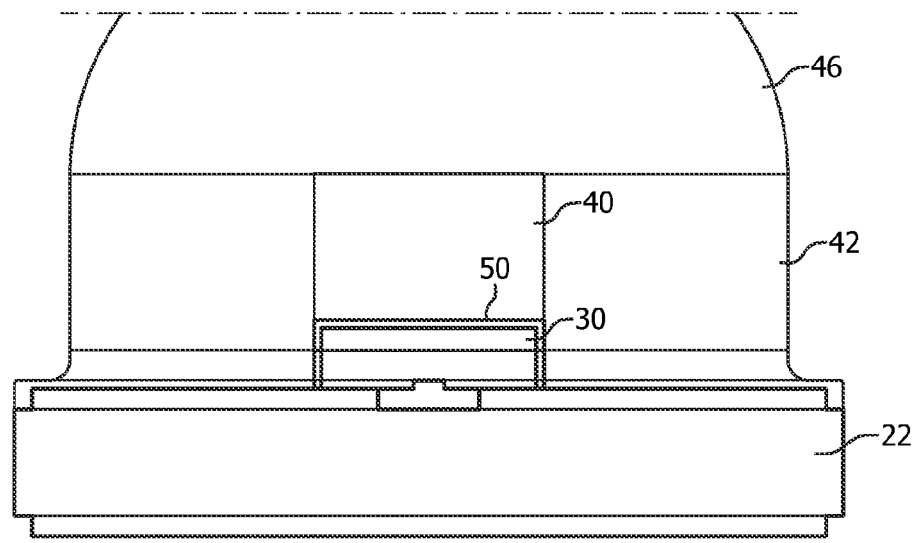
FIG. 7 is a side view of the LED die optionally coated with a phosphor.

If phosphor-converted light is desired, the LED die surface may be coated with a phosphor layer 50 prior to affixing the lens 38 over the LED die 30, as shown in FIG. 7. The index of the phosphor layer 50 preferably matches that of the pillar 40 and substrate 34.

Figure 8:
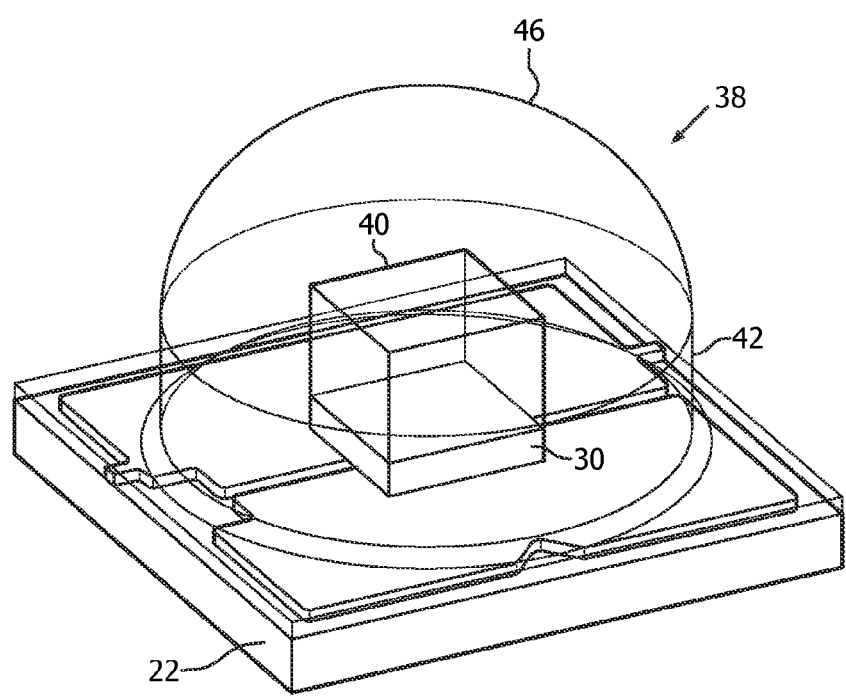
FIG. 8 is a perspective view of the completed LED device.

FIG. 8 is a perspective view of the resulting LED device.

The cylinder 42 and dome 46 provide an index transition to the air (n=1), so as to improve light extraction, and make the light emission more Lambertion. Lenses other than hemispherical domes may be used to create a desired emission pattern. The dome shape may be adapted to the actual emission from the pillar 40 to further increase extraction efficiency.

Since the pillar 40 is relatively tall, and the interface of the cylinder 42 and the pillar 40 has a significant index mismatch, the light emitted from the LED die 30 will either directly pass through the top surface of the pillar 40 or be internally reflected off the sides of the pillar and through the top surface, as shown by the light ray 51 in FIG. 6. Thus, there is reduced side light that needs to be reflected by the submount 22. Accordingly, the pillar 40 serves to narrow the emission field, since it is as wide as the LED die 30 itself, as well as improves efficiency since less light is attenuated by the submount surface.

The height of the pillar 40 can be designed such the TIR of light rays incident on the top surface of the pillar 40 is substantially minimized. This can be done by applying the following design rule for a square die.

$$height_{pillar} = \frac{\sqrt{2 \cdot area}}{\tan\left[asin\left(\frac{n_{lens}}{n_{pillar}}\right)\right]} - height_{substrate} - height_{epoxy}$$

where "area" is the die area.

Applying the above equation implies that no direct rays exiting the LED die 30 will undergo TIR at the top surface of the pillar 40 (i.e., the side furthest away from the die 30). Here it is assumed that no refraction exists at the substrate-epoxy-pillar interfaces. Typical values of 1 mm² for the die area, n=1.5 for the lens, n=1.8 for the pillar and substrate 34, 200 microns for the substrate 34, and 10 microns for the epoxy adhesive (or silicone) lead to a minimum pillar 40 height of 770 microns.

Figure 9:
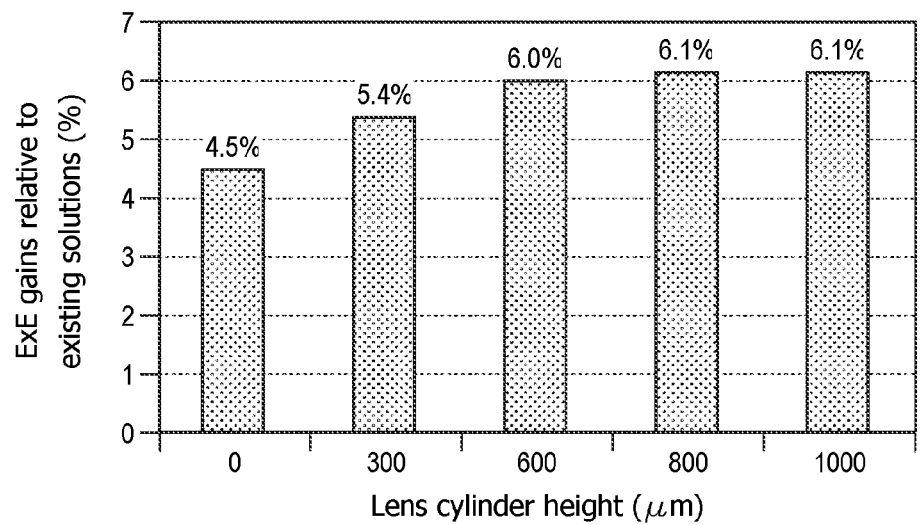
FIG. 9 is a graph showing simulated light extraction efficiency improvements versus lens cylinder height compared to conventional LED devices, such as shown in FIGS. 1 and 2.

Because back reflections off the submount 22 are reduced, the emission field is narrowed, compared to the considerably wide emission field in PSS based flip chip devices as a consequence of large submount reflections. Thus, further adapting the lens shape according to such a narrow emission field can yield further ExE gains. One way to achieve the latter is by adjusting the cylinder 42 height parameter of the lens 38. FIG. 9 shows that significant gains are obtained by increasing the cylinder 42 height (along with the height of the pillar 40). Simulation results indicate that ExE can be increased by as much as 6% with respect to the state-of-the-art solutions, exemplified by FIGS. 1 and 2.

Figure 10:
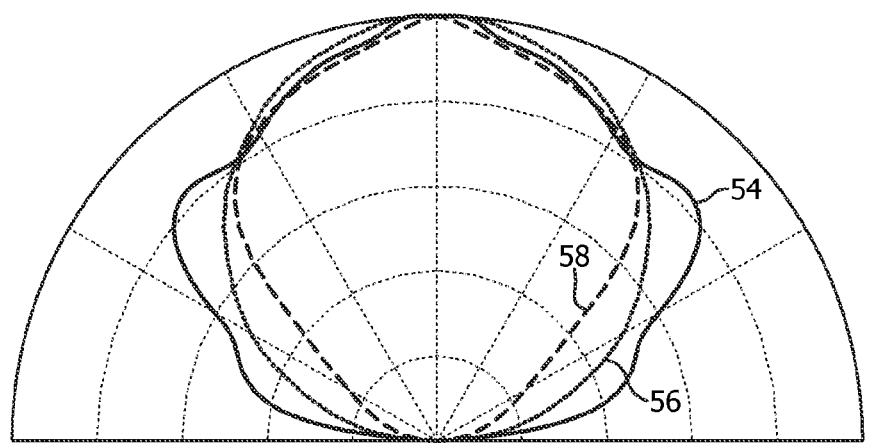
FIG. 10 is a plot illustrating the narrowed emission profile of the LED device of FIG. 8 compared to the LED devices of FIGS. 1 and 2.

FIG. 10 shows the resulting far-field comparison using a 800 micron cylinder 42 height. The line 54 represents the field emission pattern of a state-of-the art Patterned Sapphire Substrate (PSS) flip chip LED device, such as that of FIGS. 1 and 2. The line 56 represents a Lambertian emission pattern. The line 58 represents a typical emission pattern of the LED device in accordance with the present invention, where the pattern can be tailored by changing the heights of the cylinder/pillar. Further, control of the emission pattern can be obtained by the shape of the dome 46.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting device comprising:
   a light emitting diode (LED) die comprising:
      epitaxial layers, wherein the epitaxial layers have sides, and each side has a lateral length;
      a substrate having a first substrate surface and a second substrate surface overlying the epitaxial layers, wherein the first substrate surface is directly connected to the epitaxial layers, and wherein the substrate has a first index of refraction;
      a transparent pillar overlying the second substrate surface, the pillar having a second index of refraction and having a top surface and side walls, the pillar having a height greater than the lateral length of one of the sides of the epitaxial layers; and
      a lens portion surrounding the pillar, the lens portion having a third index of refraction lower than the second index of refraction to cause total internal reflection (TIR) within the pillar at an interface of the pillar side walls and the lens portion,
      wherein the pillar is configured to reflect an amount of light, generated by the epitaxial layers, from its side walls, by the TIR, toward the top surface of the pillar to cause light to exit through the top surface.

2. The device of claim 1 wherein the second index of refraction is within 10% of the first index of refraction.

3. The device of claim 1 wherein the third index of refraction is within 0.6-0.85 times the second index of refraction.

4. The device of claim 1 wherein the third index of refraction is approximately 0.8 times the second index of refraction.

5. The device of claim 1 wherein the pillar is a rectangular prism.

6. The device of claim 1 wherein a footprint of the pillar is approximately equal to an area of the second substrate surface.

7. The device of claim 1 wherein the first substrate surface is rectangular, including a square, and a footprint of the pillar is also rectangular.

8. The device of claim 1 wherein the light emitting diode (LED) die is coated with phosphor, the phosphor preferably having a refractive index matching the index of the pillar.

9. The device of claim 1 wherein the lens portion comprises:
   a cylindrical portion surrounding the pillar; and
   a top lens portion overlying the pillar and the cylindrical portion.

10. The device of claim 9 wherein the top lens portion has a dome shape.

11. The device of claim 1 wherein the pillar and the lens portion are affixed over the LED die using an adhesive.

12. The device of claim 1 further comprising a support substrate on which the LED die is mounted, the lens portion extending down to a top surface of the support substrate.

13. The device of claim 1 wherein the lens portion comprises a material molded around the pillar.

14. The device of claim 1 wherein the substrate is a growth substrate for the epitaxial layers.

* * * * *